US012610846B2

(12) United States Patent
Chew

(10) Patent No.: US 12,610,846 B2
(45) Date of Patent: Apr. 21, 2026

(54) SEMICONDUCTOR ENCAPSULATION METHOD AND SEMICONDUCTOR ENCAPSULATION STRUCTURE

(71) Applicant: CR Runan Technologies (Chongqing) Co., Ltd., Chongqing (CN)

(72) Inventor: Jimmy Chew, Chongqing (CN)

(73) Assignee: CR RUNAN TECHNOLOGIES (CHONGQING) CO., LTD., Chongqing (CN)

( * ) Notice: Subject to any disclaimer, the term of this patent is extended or adjusted under 35 U.S.C. 154(b) by 452 days.

(21) Appl. No.: 17/764,856

(22) PCT Filed: Sep. 29, 2020

(86) PCT No.: PCT/CN2020/118907
§ 371 (c)(1),
(2) Date: Mar. 29, 2022

(87) PCT Pub. No.: WO2021/058031
PCT Pub. Date: Apr. 1, 2021

(65) Prior Publication Data
US 2022/0399207 A1      Dec. 15, 2022

(30) Foreign Application Priority Data
Sep. 29, 2019   (CN) .......................... 201910936755.5

(51) Int. Cl.
| | |
|---|---|
| *H01L 23/29* | (2006.01) |
| *H01L 21/56* | (2006.01) |
| *H01L 23/00* | (2006.01) |
| *H01L 23/31* | (2006.01) |

(52) U.S. Cl.
CPC .......... *H01L 21/568* (2013.01); *H01L 23/295* (2013.01); *H01L 23/3157* (2013.01); *H01L 24/20* (2013.01); *H01L 2224/2101* (2013.01)

(58) Field of Classification Search
CPC ... H01L 23/295; H01L 23/3157; H01L 24/20; H01L 21/568
See application file for complete search history.

(56) References Cited

U.S. PATENT DOCUMENTS

| | | | | |
|---|---|---|---|---|
| 9,368,460 | B2 * | 6/2016 | Yu ........................ | H01L 23/5389 |
| 9,837,359 | B1 | 12/2017 | Chiu et al. | |
| 10,163,858 | B1 * | 12/2018 | Liu .......................... | H01L 24/82 |
| 11,069,642 | B2 * | 7/2021 | Lin ...................... | H01L 21/4853 |
| 11,081,369 | B2 * | 8/2021 | Cheng .................... | H01L 21/56 |
| 12,033,949 | B2 * | 7/2024 | Lin ........................ | H01L 21/568 |

(Continued)

FOREIGN PATENT DOCUMENTS

| | | |
|---|---|---|
| CN | 104160491 A | 11/2014 |
| CN | 105206592 A | 12/2015 |

*Primary Examiner* — Eugene Lee
(74) *Attorney, Agent, or Firm* — MUNCY, GEISSLER, OLDS & LOWE, P.C.

(57) ABSTRACT

A semiconductor encapsulation method, comprising: forming a protection layer on a front side of a chip to be encapsulated; arranging said chip, with the protection layer being formed on the front side thereof, on a carrier plate, wherein the front side of said chip faces upwards and a back side thereof faces the carrier plate; and encapsulating, on the carrier plate, said chip and the protection layer to form a plastic encapsulation layer. Further provided is a semiconductor encapsulation structure.

11 Claims, 8 Drawing Sheets

(56)         References Cited

U.S. PATENT DOCUMENTS

|                   |        |         |      |              |
| ----------------- | ------ | ------- | ---- | ------------ |
| 12,185,461    | B2 *   | 12/2024 | Wang | ...................... H05K 1/113 |
| 2015/0155262  | A1 *   | 6/2015  | Kim  | .................... H01L 23/3128 |
|                   |        |         |      | 438/126      |
| 2018/0151393  | A1     | 5/2018  | Chew |              |
| 2019/0067001  | A1 *   | 2/2019  | Chen | ........................ H01L 24/19 |
| 2019/0148340  | A1 *   | 5/2019  | Yu   | ........................... H01L 21/56 |
|                   |        |         |      | 257/737      |
| 2020/0091073  | A1 *   | 3/2020  | Liao | ................. H01L 21/76801 |
| 2020/0203302  | A1 *   | 6/2020  | Chew | ...................... H01L 24/73 |

* cited by examiner

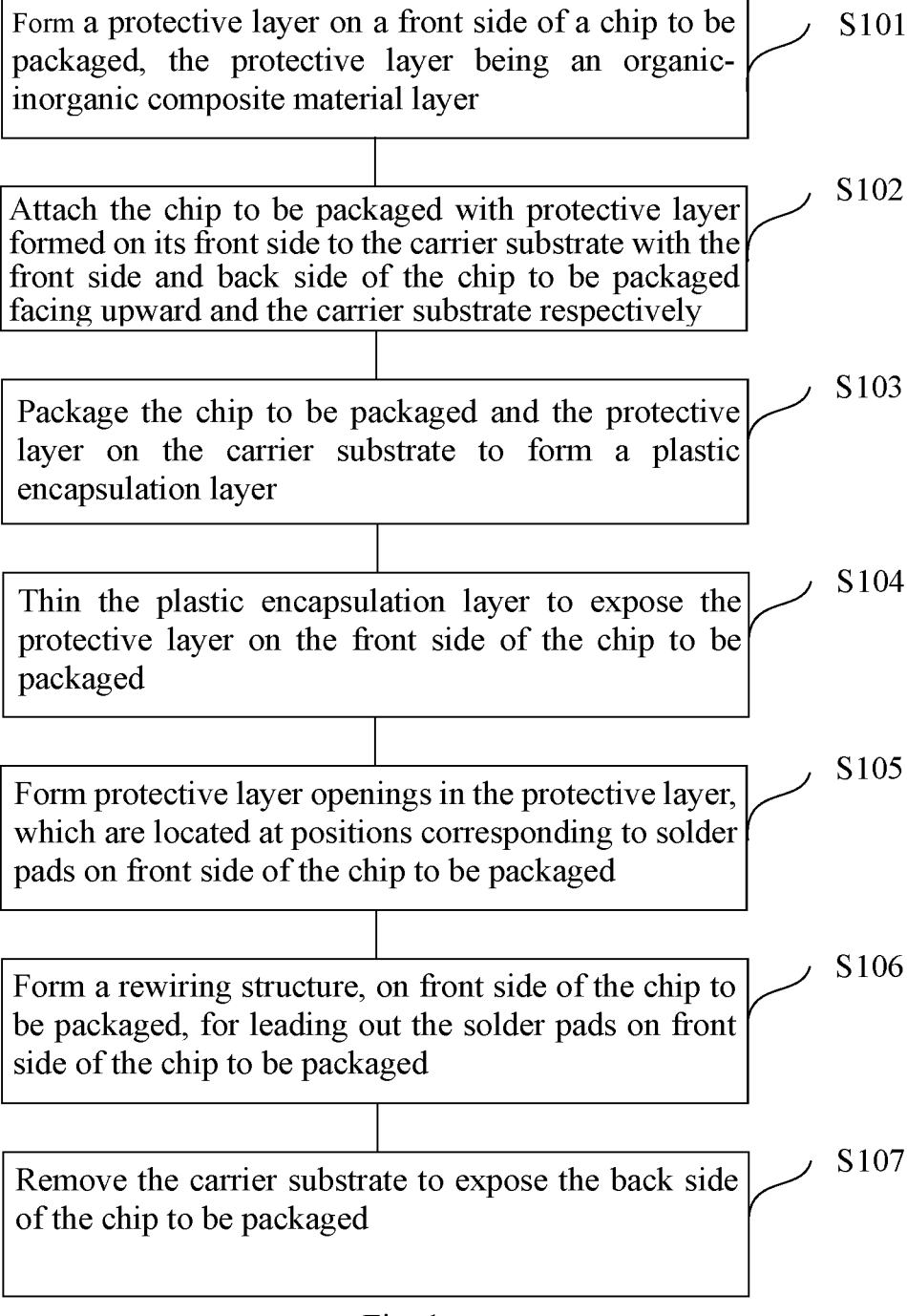

Form a protective layer on a front side of a chip to be packaged, the protective layer being an organic-inorganic composite material layer ⟋ S101

Attach the chip to be packaged with protective layer formed on its front side to the carrier substrate with the front side and back side of the chip to be packaged facing upward and the carrier substrate respectively ⟋ S102

Package the chip to be packaged and the protective layer on the carrier substrate to form a plastic encapsulation layer ⟋ S103

Thin the plastic encapsulation layer to expose the protective layer on the front side of the chip to be packaged ⟋ S104

Form protective layer openings in the protective layer, which are located at positions corresponding to solder pads on front side of the chip to be packaged ⟋ S105

Form a rewiring structure, on front side of the chip to be packaged, for leading out the solder pads on front side of the chip to be packaged ⟋ S106

Remove the carrier substrate to expose the back side of the chip to be packaged ⟋ S107

SEMICONDUCTOR ENCAPSULATION METHOD AND SEMICONDUCTOR ENCAPSULATION STRUCTURE

TECHNICAL FIELD

Present disclosure relates to the field of semiconductor technology, and more particularly, to a semiconductor packaging method and a semiconductor packaging structure.

BACKGROUND

In recent years, the continuous development of circuit integration technology has resulted in a trend of electronic products toward miniaturization, intelligence, high performance and high reliability. Packaging is a factor affecting performance and limiting miniaturization of such products.

However, in conventional chip packaging structures, chips generate heat during operation. If the generated heat is not dissipated timely, it would adversely affect the operating efficiency and service lives of the chips.

SUMMARY

One aspect of present disclosure provides a semiconductor packaging method, comprising:

forming a protective layer on a front side of a chip to be packaged;

attaching the chip to be packaged, with the protective layer formed on the front side thereof, to a carrier substrate in such a manner that the front side of the chip to be packaged faces upward and a back side of the chip to be packaged faces the carrier substrate; and packaging the chip to be packaged and the protective layer on the carrier substrate to form a plastic encapsulation layer.

Optionally, the protective layer is made of an organic-inorganic composite material comprising an organic material and filler particles dispersed in the organic material. The filler particle is made of an inorganic material.

Optionally, the plastic encapsulation layer is made of an organic-inorganic composite material comprising an organic material and filler particles dispersed in the organic material. The filler particle is made of an inorganic material.

Optionally, the filler particle is an inorganic oxide particle.

Optionally, the filler particles include at least one of $SiO_2$ particles and $TiO_2$ particles.

Optionally, the method further comprises, prior to the attachment of the chip to be packaged with the protective layer formed on the front side thereof to the carrier substrate, grinding the back side of the chip to be packaged.

Optionally, the method further comprises, subsequent to the formation of the plastic encapsulation layer, thinning the plastic encapsulation layer to expose the protective layer on the front side of the chip to be packaged, forming protective layer openings to expose solder pads on the front side of the chip to be packaged, and forming, on the front side of the chip to be packaged, a rewiring structure to lead out the solder pads on the front side of the chip to be packaged.

Optionally, the method further comprises, subsequent to the formation of the rewiring structure on the front side of the chip to be packaged, forming an antioxidation layer on the rewiring structure. The rewiring structure includes an electrically conductive component and a dielectric layer covering a part of the electrically conductive component. The antioxidation layer covers the remaining part of the electrically conductive component that is not covered by the dielectric layer.

Optionally, the antioxidation layer includes any one of a tin layer, a bottom-up stack of a nickel layer and a gold layer, and a bottom-up stack of a nickel layer, a palladium layer and a gold layer.

Optionally, the method further comprises, subsequent to the formation of the rewiring structure on the front side of the chip to be packaged, removing the carrier substrate to expose the back side of the chip to be packaged.

Another aspect of present disclosure provides a semiconductor packaging structure comprising:

a plastic encapsulation layer provided with a concave cavity;

a chip disposed in the cavity, wherein a back side of the chip is exposed from a surface of the plastic encapsulation layer;

a protective layer formed on a front side of the chip having protective layer openings formed therein to expose solder pads on the front side of the chip; and a rewiring structure formed on the front side of the chip, wherein the rewiring structure is configured to lead out the solder pads on the front side of the chip.

Optionally, the protective layer is made of an organic-inorganic composite material comprising an organic material and filler particles dispersed in the organic material. The filler particle is made of an inorganic material.

Optionally, the filler particles are inorganic oxide particles.

Optionally, the inorganic oxide particles in the protective layer include at least one of $SiO_2$ particles and $TiO_2$ particles.

Optionally, the semiconductor packaging structure further includes an antioxidation layer. The rewiring structure includes an electrically conductive component and a dielectric layer covering a part of the electrically conductive component, and the antioxidation layer covers the remaining part of the electrically conductive component that is not covered by the dielectric layer.

In the above semiconductor packaging method and structure provided in embodiments of present disclosure, by attaching the back side of the chip to be packaged on the carrier substrate with its front side facing upward, it allows the back side of the chip to be packaged to be exposed from the packaging structure after the carrier substrate is removed. This helps improve the chip's heat dissipation performance, and enables to assure the continuous efficient operation of chips and to solve the problem of a shortened life of chips due to the overheat. Additionally, by configuring the protective layer on the front side of the chip to be packaged made of the organic-inorganic composite material, it enables to effectively mitigate discrepancies between the chip to be packaged and the protective layer in terms of material properties as the organic-inorganic composite material combines characteristics of both organic and inorganic material, thereby enabling to lower the difficulty of the packaging process, enhance packaging quality and ensure packaging success and satisfactory yield.

BRIEF DESCRIPTION OF THE DRAWINGS

FIG. 1 is a flowchart of a semiconductor packaging method according to an exemplary embodiment of present disclosure.

DETAILED DESCRIPTION

Figure 2A:
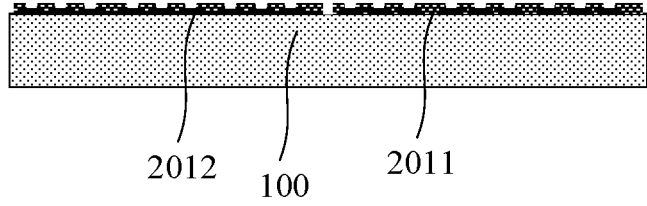
FIG. 2(*a*) to FIG. 2(*m*) show a process flowchart of a semiconductor packaging method according to an exemplary embodiment of present disclosure.
Figure 2B:
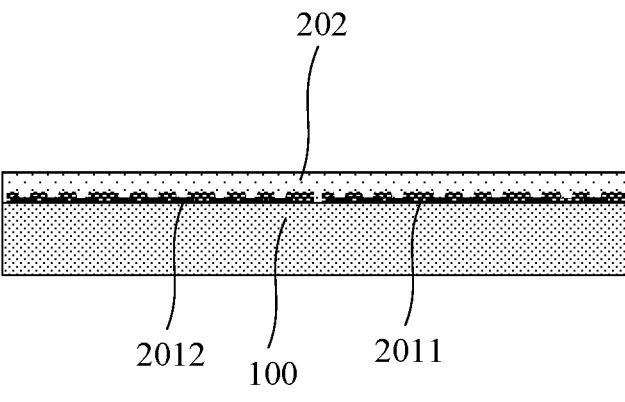

Here, exemplary embodiments will be described in detail, examples of which are shown in the accompanying drawings. When referring to the drawings below, unless otherwise indicated, a same numeral in drawings represent the same or similar element. The exemplary embodiments described hereunder do not represent all possible embodiments consistent with the present disclosure. Rather, they are merely examples of device and methods consistent with some aspects of present disclosure as detailed in the appended claims.

The terminology used herein is for the purpose of describing particular embodiments only and is not intended to limit present disclosure. Unless defined otherwise, all technical and scientific terms used herein have the same meaning as commonly understood by one of ordinary skill in the art to which present disclosure belongs. As used herein and in the appended claims, the terms "a" and "an" do not denote a limitation of quantity, but rather denote the presence of at least one of the referenced items. The term of "a plurality of" denote the presence of two or more of the referenced items. The use of "include", "comprise" and the like herein is meant that the items listed theretofore encompass the items listed thereafter and equivalents thereof but do not preclude the presence of other items. Further, the terms "connect", "couple" and the like are not restricted to physical or mechanical connections or couplings, and can include electrical connections or couplings, whether direct or indirect. The terms "upper" and/or "lower" and the like used herein are merely for ease of description, and should not be construed as being limited to a particular position or a particular spatial orientation. As used herein and in the appended claims, the singular forms "a", "an", and "the" are intended to include the plural forms as well, unless the context clearly indicates otherwise. It will be also understood that, as used herein, the term "and/or" includes any and all combinations of one or more of the associated listed items.

Figure 2C:
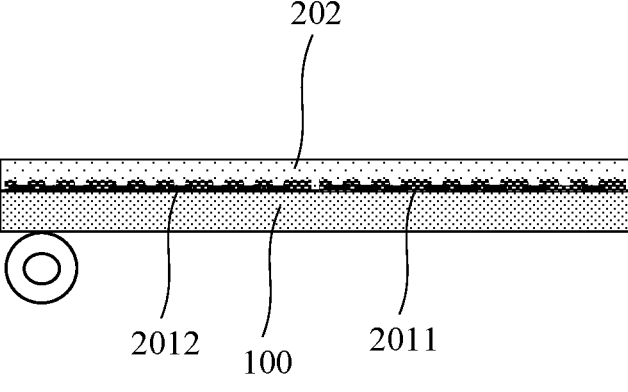
Figures 2D, 2E:
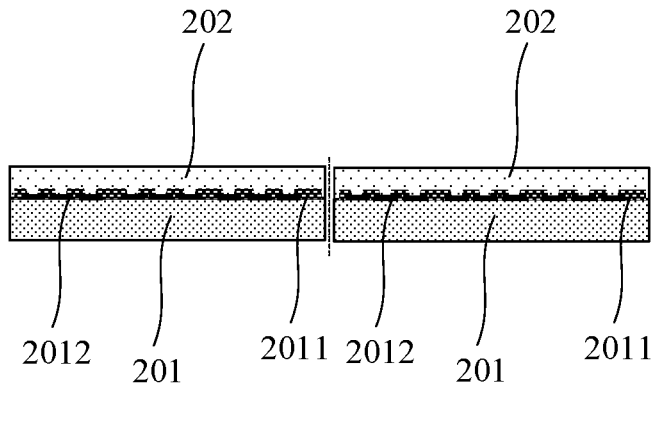
Figure 2F:
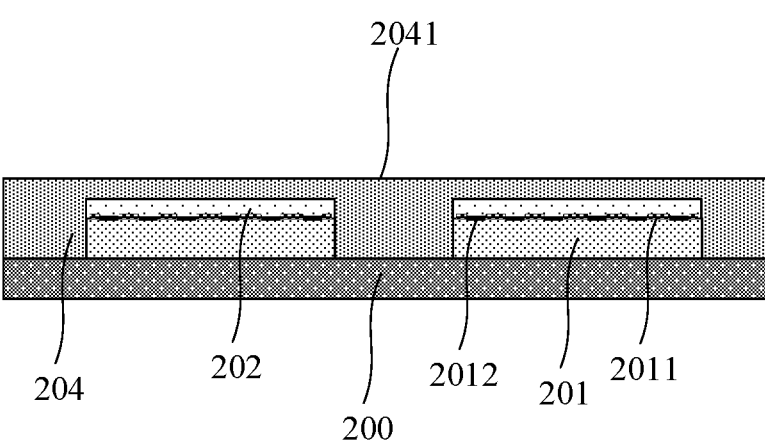
Figure 2G:
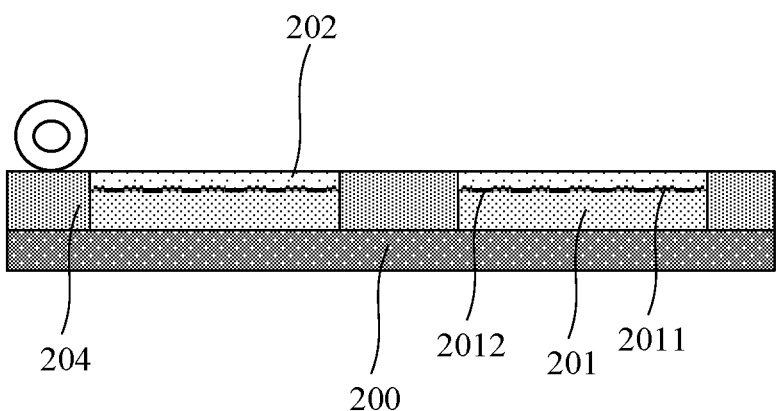
Figure 2H:
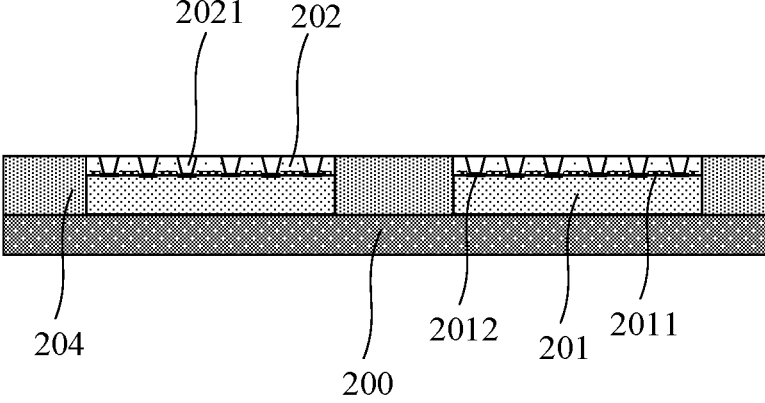
Figure 2I:
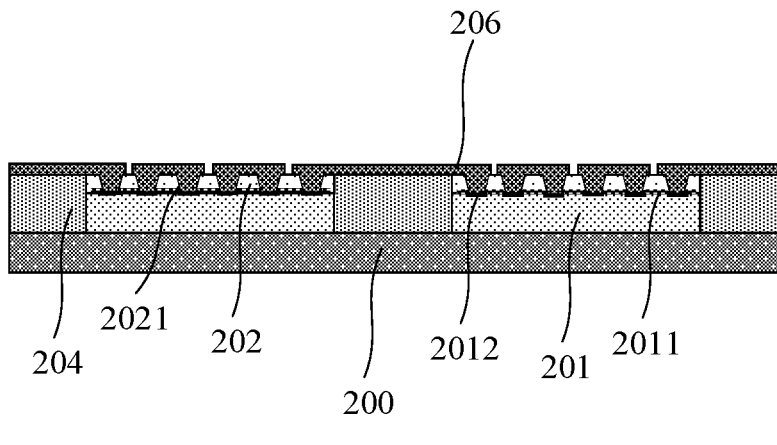
Figure 2J:
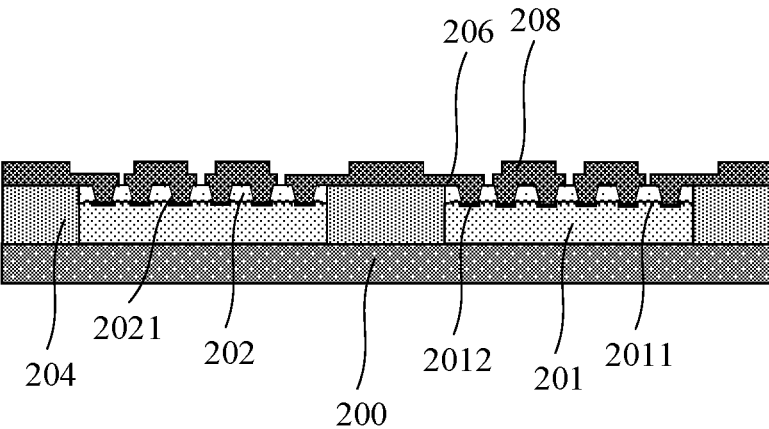
Figure 2K:
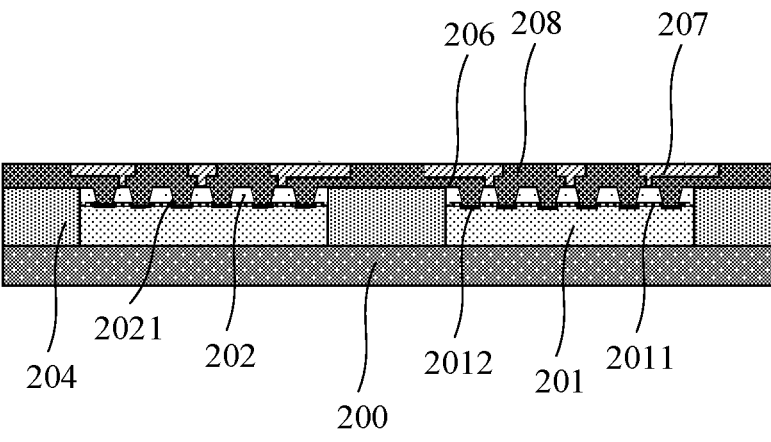
Figure 2L:
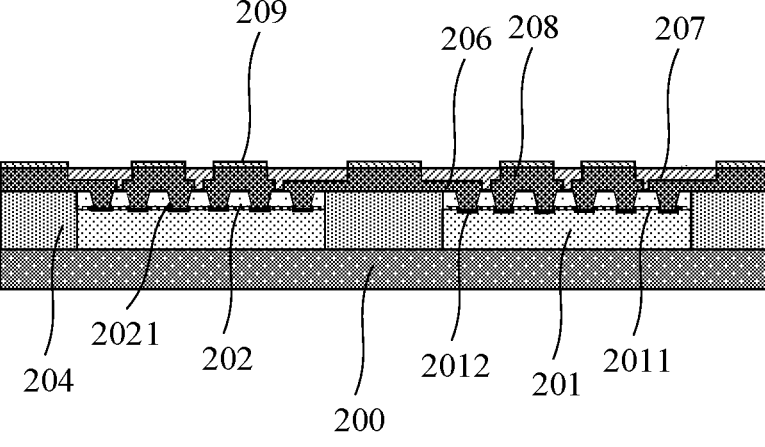
Figure 2M:
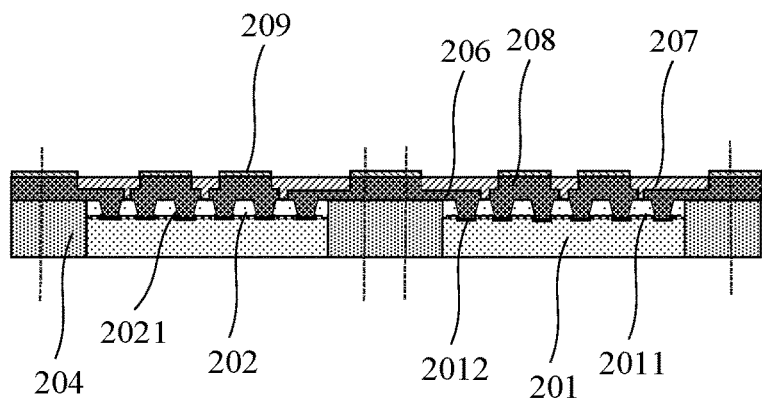
Figure 3:
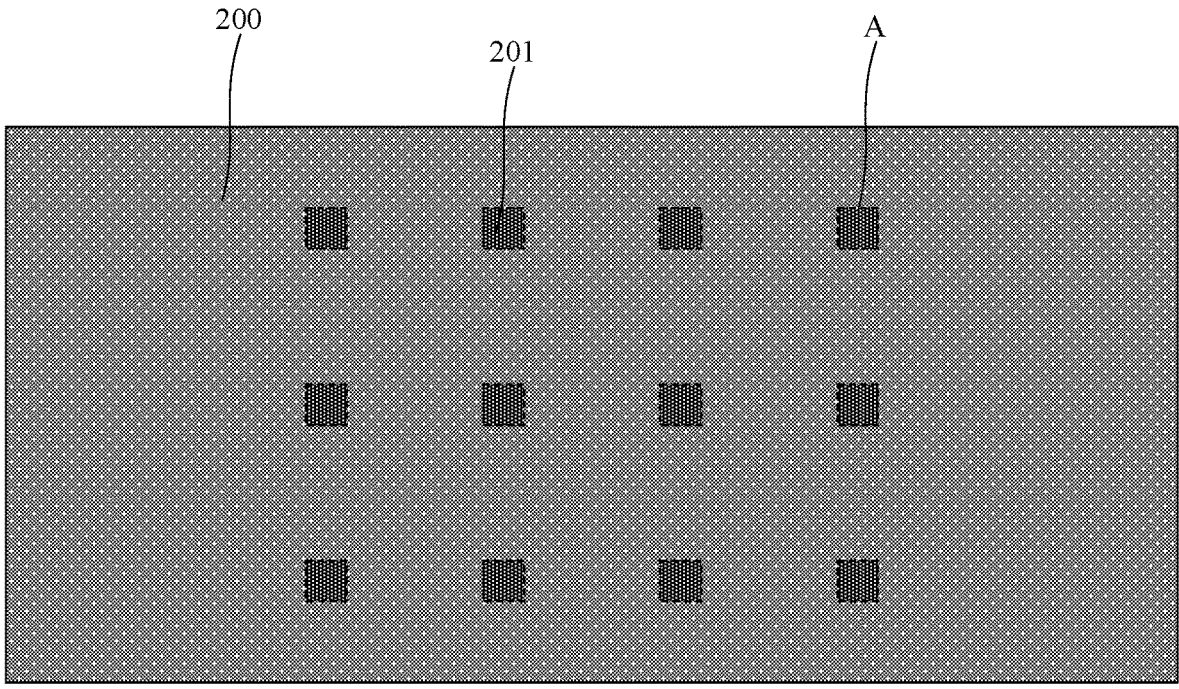
FIG. 3 is a structural schematic of a front side of a carrier substrate according to an exemplary embodiment of present disclosure.
Figure 4:
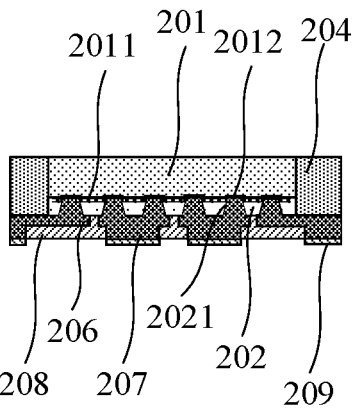
FIG. 4 is a structural schematic of a semiconductor packaging structure produced using the semiconductor packaging method according to an exemplary embodiment of present disclosure.

As shown in FIG. 1, FIG. 2(*a*) to FIG. 2(*m*), FIG. 3 and FIG. 4, present disclosure provides a semiconductor packaging method and a semiconductor packaging structure.

FIG. 1 is a flowchart of a semiconductor packaging method proposed in an exemplary embodiment of present disclosure. As shown in FIG. 1, the semiconductor packaging method includes the steps as follows.

In step 101, a protective layer is formed on a front side of a chip to be packaged. The protective layer may be an organic-inorganic composite material layer made of an organic-inorganic composite material.

In step 102, the chip to be packaged with the protective layer formed on its front side is placed on a carrier substrate in such a manner that the front side of the chip to be packaged faces upward and a back side of the chip to be packaged faces the carrier substrate. In an embodiment of present disclosure, the chip to be packaged may be attached to the carrier substrate.

In step 103, the chip to be packaged and the protective layer are packaged on the carrier substrate to form a plastic encapsulation layer.

In step 104, the plastic encapsulation layer is thinned to expose the protective layer on the front side of the chip to be packaged.

In step 105, protective layer openings are formed to expose solder pads on the front side of the chip to be packaged.

In step 106: a rewiring structure for leading out the solder pads on the front side of the chip to be packaged is formed over the front side of the chip to be packaged.

In step 107: the carrier substrate is removed to expose the back side of the chip to be packaged. In an embodiment of present disclosure, a lift-off process may be used to remove the carrier substrate.

In the semiconductor packaging method according to this embodiment, by placing the back side of the chip to be packaged on the carrier substrate with its front side facing upward, it allows the back side of the chip to be packaged to be exposed from the packaging structure after the carrier substrate is removed. This helps improve the chip's heat dissipation performance, and enables to assure the continuous efficient operation of chips and to solve the problem of a shortened life of chips due to the overheat. Additionally, by configuring the protective layer on the front side of the chip to be packaged made of the organic-inorganic composite material, it enables to effectively mitigate discrepancies between the chip to be packaged and the protective layer in terms of material properties as the organic-inorganic composite material combines characteristics of both organic and inorganic material, thereby enabling to lower the difficulty of the packaging process, enhance packaging quality and ensure packaging success and satisfactory yield. Further, during the formation and thinning (e.g., grinding) of the plastic encapsulation layer, the protective layer allows to effectively protect the solder pads on the front side of the chip to be packaged and electrical interconnects inside the chip to be packaged from being possibly damaged.

In an embodiment of present disclosure, in step 101, the protective layer is formed on the front side of the chip to be packaged, and the protective layer may be an organic-inorganic composite material layer. As an example, such a protective layer may be first formed on a front side of a semiconductor wafer, and the semiconductor wafer is then diced to produce a plurality of chips to be packaged having the protective layer formed on the front side thereof. Of course, it will be understood that, if technically feasible, it is also possible to form the protective layer on the front side of each chip to be packaged after the semiconductor wafer is diced to produce a plurality of chips to be packaged. A suitable choice may be made depending on actual circumstances.

As shown in FIG. 2(*a*), the front side of the semiconductor wafer 100 (corresponding to the front side of the chip 201 to be packaged) has an insulating layer 2011 and solder pads 2012 for electrically connecting with external elements. The front side of the chip 201 to be packaged is the active surface of the chip 201 to be packaged.

As shown in FIG. 2(*b*), a protective layer 202 is formed on the front side of the semiconductor wafer 100 (corresponding to the front side of the chip 201 to be packaged). The protective layer 202 may be an organic-inorganic composite material layer. For example, the organic-inorganic composite material layer is made of an organic-inorganic composite material. The organic-inorganic composite material includes an organic material and filler particles dispersed in the organic material. The filler particles are made of an inorganic material. Since the chip to be packaged is generally made of an inorganic material such as silicon, the organic-inorganic composite material combining the properties of both organic and inorganic materials is able to effectively mitigate discrepancies between the chip to be packaged and the protective layer in terms of material properties, thereby enabling to lower the difficulty of the packaging process, enhance packaging quality and ensure packaging success and satisfactory yield.

The organic material layer in the protective layer 202 may be made of the material selected from the group consisting of, for example, benzocyclobutene (BCB), polyimide (PI), polybenzoxazole (PBO), organic polymers, organic resins and other materials having similar insulation properties and structural properties. Optionally, the organic material layer in the protective layer may be made of the insulating material that is tolerable to chemical cleaning, polishing, etc.

The filler particles in the protective layer 202 may be inorganic oxide particles. For example, the filler particles in the protective layer 202 may include at least one of $SiO_2$ particles and $TiO_2$ particles. In an embodiment of present disclosure, all filler particles in the protective layer 202 may be $SiO_2$ particles, which allow a better packaging performance.

For example, the filler particles in the protective layer 202 may be present at an amount ranging from 50 w.t. % to 95 w.t. %. When the filler particles are spherical and present at an amount of 50 w.t. % to 95 w.t. %, the filler particles enable the protective layer to be comparable to silicon in terms of material properties, which is favorable to the packaging process.

Further, the filler particles in the protective layer 202 may be present at an amount ranging from 80 w.t. % to 90 w.t. %, which enables the protective layer to be closer to silicon in terms of material properties, which is favorable to the packaging process.

In an embodiment of present disclosure, the filler particles in the protective layer 202 are spherical. Such spherical filler particles in the protective layer 202 are conductive to formation of protective layer openings with smooth side walls in the subsequent step of forming protective layer openings.

In an embodiment of present disclosure, the filler particles in the protective layer 202 may have a particle size of 0.8 μm to 1.2 μm. This is because a small size of the filler particles facilitates the formation of protective layer openings with smooth side walls in the protective layer and thus enables the sufficient filling of an electrically conductive material during the filling step. On the contrary, the large filler particles tend to form protective layer openings having large bumps and dips on their side walls in the protective layer. The bumps will impede the filling of an electrically conductive material at the back side of the bumps, and thus lead to insufficient electrical conduction of the filled electrically conductive through hole. In addition, the use of the 0.8 μm to 1.2 μm sized filler particles enables to expose the small sized filler particles during the formation of protective layer openings, which offers the side wall a certain degree of roughness. The side wall with a certain degree of roughness results in an expanded contact area and a closer contact with the electrically conductive material, thereby enabling to form electrically conductive through holes with good electrical conduction properties. On the other hand, since the fabrication cost raises with the reduction of particle size, the filler particles is preferred to have an average particle size of 1 μm.

The protective layer may be formed on the front side of the semiconductor wafer 100 (corresponding to the front side of the chip 201 to be packaged) by lamination, coating, printing or otherwise. Temperature, pressure, duration and other conditions of these techniques may vary depending on the materials of the protective layer, and different such materials may have different curing behaviors.

Subsequent to the formation of the protective layer 202, as shown in FIG. 2(c), back side of the semiconductor wafer 100 (i.e., the back side of the chip 201 to be packaged) is ground to reduce thickness of the chip to be packaged. In some embodiments, the step of grinding the back side of the semiconductor wafer 100 (corresponding to the back side of the chip 201 to be packaged) may be omitted, and the process may instead directly proceed to the next step.

Afterwards, as shown in FIG. 2(d), the semiconductor wafer 100 with the formed protective layer 202 is diced along dicing lanes to produce a plurality of chips 201 to be packaged, each having the formed protective layer 202.

In step 102, as shown in FIG. 2(e), the chip 201 to be packaged with the protective layer 202 formed on its front side (a plurality of chips to be packaged are shown in the figure) is placed on a carrier substrate 200. For example, the back side of the chip 201 to be packaged may be attached to the carrier substrate 200 by an adhesive layer (not shown in the figure). The adhesive layer may be formed of an easily strippable material, in order to facilitate subsequent separation of the carrier substrate 200 from the chip 201 to be packaged. For example, the adhesive layer may be formed of a thermally separable material which will lose its adhesiveness when heated.

In alternative embodiments, the adhesive layer may be in a double-layered structure consisting of a thermally separable material layer and a chip adhesion layer. The thermally separable material layer may be bonded to the carrier substrate 200 and may lose adhesiveness when heated so as to be stripped away from the carrier substrate 200. The chip adhesion layer may be made of an adhesive material layer and can bond the chip 201 to be packaged. After the chip 201 to be packaged is separated from the carrier substrate 200, the chip adhesion layer may be removed by chemical cleaning. In an embodiment, the adhesive layer may be formed on the carrier substrate 200 by lamination, printing or otherwise.

In one embodiment, as shown in FIG. 3, an adhesion location for the chip 201 to be packaged may be pre-marked on the carrier substrate 200. Subsequent to the formation of the adhesive layer, the chip 201 to be packaged may be bonded, each in an orientation with the back side facing the carrier substrate 200, to the carrier substrate 200 at the predetermined location A. In one embodiment, prior to the formation of the adhesive layer, the adhesion location for the chip to be packaged may be pre-marked on the carrier substrate 200 by means of laser, mechanical or photolithographic engraving or otherwise. At the same time, an alignment mark may be provided on the chip 201 to be packaged in order to facilitate its alignment with the adhesion location of the carrier substrate 200. In one embodiment, the protective layer may be transparent for some light so that the alignment mark on the chip 201 to be packaged is visible. This allows the chip to be correctly and accurately bonded to the predetermined location A. It will be appreciated that a plurality of chips to be packaged 201 may be packaged in one packaging cycle. That is to say, a plurality of chips to be packaged 201 may be simultaneously placed on the carrier substrate 200 for packaging, and then diced into plurality of packages after the complete of the packaging. One package may contain one or more of the chips to be packaged. The locations of the plurality of chips to be packaged may be determined freely as required by the final products.

In step 103, as shown in FIG. 2(*f*), a plastic encapsulation layer 204 covers the carrier substrate 200, specifically, the adhesive layer of the carrier substrate 200, and is formed on the carrier substrate 200 and the protective layer 202. The plastic encapsulation layer 204 is formed to entirely encapsulate the carrier substrate 200 and the chip 201 to be packaged to reconstruct a flat plate structure.

In this embodiment, the plastic encapsulation layer 204 may be formed of laminated epoxy resin films or Ajinomoto buildup films (ABF). Alternatively, it may be formed by injection molding, compression molding or transfer molding of an epoxy resin compound.

In alternative embodiment, like the protective layer 202, the plastic encapsulation layer 204 may be formed of an organic-inorganic composite material including an organic material and filler particles dispersed in the organic material. The filler particles may be formed of an inorganic material.

As described above, the organic-inorganic composite material includes an organic material and filler particles dispersed in the organic material. The filler particles may be formed of an inorganic material. Since the chip to be packaged is generally made of an inorganic material such as silicon, the organic-inorganic composite material combining the properties of both organic and inorganic materials is able to effectively mitigate discrepancies between the chip to be packaged and the protective layer in terms of material properties, thereby enabling to lower the difficulty of the packaging process, enhance packaging quality and ensure packaging success and satisfactory yield.

The organic material in the plastic encapsulation layer 204 may be selected as any of various resin materials, macromolecular materials, polymeric material, e.g., epoxy resins, melamine resins or other polymers. The organic material may be one organic material or a combination of different materials. The organic material may be selected as required by the packaging process, without limitation.

The filler particles in the plastic encapsulation layer 204 may be inorganic oxide particles. For example, the filler particles in the plastic encapsulation layer 204 may include at least one of $SiO_2$ particles and $TiO_2$ particles. In an embodiment of present disclosure, the filler particles in the plastic encapsulation layer 204 may be all $SiO_2$ particles, which provides a better packaging performance.

In an embodiment of present disclosure, the filler particles in the plastic encapsulation layer 204 may be present at an amount ranging from 50 w.t. % to 95 w.t. %. When the filler particles are spherical and present at an amount of 50 w.t. % to 95 w.t. %, the filler particles enable the plastic encapsulation layer to be comparable to silicon in terms of material properties, which is favorable to the packaging process.

Further, the filler particles in the plastic encapsulation layer 204 may be present at an amount ranging from 80 w.t. % to 90 w.t. %, which enables the plastic encapsulation layer to be closer to silicon in terms of material properties and thus is favorable to the packaging process.

In an embodiment of present disclosure, the filler particles in the plastic encapsulation layer 204 may be spherical.

The particle size of the filler particles in the protective layer 202 may be smaller than that of the filler particles in the plastic encapsulation layer 204. That is, the particle size of the filler particles in the plastic encapsulation layer 204 may be greater than that of the filler particles in the protective layer 202. For example, the particle size of the filler particles in the plastic encapsulation layer 204 may range from 4 μm to 6 μm. Since it is not necessary to form any opening in the plastic encapsulation layer 204, filler particles with large particle size may be used to reduce the fabrication cost. In an embodiment of present disclosure, the filler particles in the plastic encapsulation layer 204 may have an average particle size of 5 μm.

Process conditions for forming the plastic encapsulation layer may vary with the material of the plastic encapsulation layer. Optionally, the plastic encapsulation layer may be formed by a method selected from the group consisting of paste printing, injection molding, hot press molding, compression molding, transfer molding, liquid sealant molding and vacuum lamination. Temperature, pressure, time of duration and other conditions of these methods may vary depending on the material of the plastic encapsulation layer, and different materials may require different curing conditions.

When encapsulating with the plastic encapsulation layer 204, the materials of the plastic encapsulation layer may penetrate between the carrier substrate 200 and the chip 201 to be packaged during the high-pressure molding. A layer of the protective layer 202 is formed on the chip 201 to be packaged. The protective layer 202 can prevent the material of the plastic encapsulation layer from penetrating up to the surface of the chip 201 to be packaged. Even when the material of the plastic encapsulation layer reaches the surface of the protective layer 202, the surface of the protective layer 202 may be directly treated by a chemical process or the polishing. In this way, the material of the plastic encapsulation layer will not come into direct contact with the front side of the chip 201 to be packaged, which in turn would not bring damage to circuitry on the front side of the chip 201 to be packaged.

In step 104, as shown in FIG. 2(*g*), the plastic encapsulation layer 204 is thinned to expose the protective layer on the front side of the chip to be packaged. The plastic encapsulation layer 204 may have a first surface 2041 opposing the carrier substrate 200, which is substantially flat and parallel to the surface of the carrier substrate 200.

The thickness of the plastic encapsulation layer 204 may be reduced by grinding or polishing the first surface 2041 until the protective layer 202 on the front side of the chip 201 to be packaged is exposed from the first surface 2041 of the plastic encapsulation layer 204. During the grinding or polishing process for thinning the plastic encapsulation layer 204, the front side of the chip 201 to be packaged is always protected by the protective layer 202. This avoids damages to the chip 201 to be packaged during the thinning of the plastic encapsulation layer 204.

In step 105, as shown in FIG. 2(*h*), protective layer openings 2021 are formed in the protective layer 202 at locations corresponding to locations of a plurality of solder pads 2012 on the chip to be packaged. Each protective layer opening 2021 in the protective layer is at least aligned with a respective one of the solder pads 2012 on the front side of the chip 201 to be packaged or lies in a circuit leading from a respective one of the solder pads 2012, so that the respective one of the solder pads 2012 or the circuit leading from a respective one of the solder pads 2012 is exposed in the protective layer opening 2021. In case the protective layer is a laser reactive material, the protective layer openings 2021 may be formed by laser patterning successively one by one. In case the protective layer is a photosensitive material, a plurality of protective layer openings 2021 may be formed at once by the photolithographic patterning. The projection of the protective layer opening 2021 in the protective layer 202 may be in a shape of a circle. Of course, it may be in another shape such as an oval, square or linear shape.

In step 106, as shown in FIG. 2(*i*) to (*k*), a rewiring process is performed on the protective layer 202 of the chip 201 to be packaged to form a rewiring structure. The front side of the chip 201 to be packaged has solder pads 2012 forming a part of an internal circuit of the chip. By rewiring on the protective layer 202 at the front side of the chip 201 to be packaged, it is able to connect the solder pads 2012 to external circuits. The formation of the rewiring structure may include the steps of: as shown in FIG. 2(*i*), forming a first rewiring layer 206 on the protective layer 202 and the plastic encapsulation layer 204, the first rewiring layer 206 electrically connecting the solder pads 2012 of the chip 201 to be packaged via the protective layer openings 2021 of the protective layer 202; as shown in FIG. 2(*j*), forming first electrically conductive mesas 208 on the first rewiring layer 206; and then, as shown in FIG. 2(*k*), forming a first dielectric layer 207 over surfaces of the first rewiring layer 206 and first electrically conductive mesas 208. The formed first dielectric layer 207 may have such a thickness that surfaces of the first electrically conductive mesas 208 are just exposed. Alternatively, the first dielectric layer 207 may be first so formed as to cover the exposed surfaces of the plastic encapsulation layer 204, the protective layer 202 and the first rewiring layer 206 and then thinned to the surfaces of the first electrically conductive mesas 208. In this case, the electrically conductive component of the rewiring structure includes the first rewiring layer 206 and the first electrically conductive mesas 208.

Projections of the first electrically conductive mesas 208 on the front side of the chip 201 to be packaged may be in a shape of a circle. Of course, it may be in another shape such as an oval, square or linear shape. The first electrically conductive mesas 208 electrically connect the first rewiring layer 206. For example, the first electrically conductive mesas 208 may be formed on the first rewiring layer 206 using a photolithography and electroplating process.

In an alternative embodiment, after the formation of the first rewiring layer 206, the first dielectric layer 207 having first openings is formed on the first rewiring layer 206 and the exposed protective layer 202 and the plastic encapsulation layer 204. Then, the first electrically conductive mesas 208 electrically connecting the first rewiring layer 206 are formed in the first openings of the first dielectric layer 207. In this case, electrically conductive component of the rewiring structure includes the first rewiring layer 206 and the first electrically conductive mesas 208.

In yet an alternative embodiment, the first openings of the first dielectric layer 207 may be not filled. That is, the first electrically conductive mesas 208 electrically connecting the first rewiring layer 206 are not formed, and the solder pads or connecting points of the first rewiring layer of the completed package are exposed over the first openings. In this case, the electrically conductive component of the rewiring structure includes only the first rewiring layer 206.

In one embodiment, the first dielectric layer 207 may be formed by lamination, molding or printing. In addition, the first dielectric layer 207 may be made of an epoxy compound.

Further, in one embodiment, the rewiring process may be repeatedly performed on the front side of the chip 201. For example, a second rewiring layer and optionally one or more additional rewiring layers may be formed over the plastic encapsulation layer 204 at the front side of the chip 201, so as to achieve the multilayer rewiring of the product.

Further, in an optional embodiment, during the formation of the rewiring structure, if a homogeneous surface formed of a single material is needed, a passivation layer may be formed on the protective layer 202. For example, passivation layer openings corresponding to the protective layer 2021 openings may be formed in the passivation layer in order to enable rewiring.

In one embodiment, since the protective layer openings have been formed in the protective layer 202, at least the protective layer openings are directly visible when forming the first rewiring layer 206. This allows more accurate alignment when forming the first rewiring layer 206.

In another embodiment, subsequent to the formation of the protective layer openings 2021 at a plurality of locations corresponding to the solder pads 2012 of the chip to be packaged, the method may further include filling an electrically conductive medium in the protective layer openings to cause the electrically conductive medium to electrically connect the solder pads 2012 of the chip to be packaged. The electrically conductive medium may form vertical interconnects in the protective layer openings, which lead the solder pads 2012 on surface of the chip to the surface of the protective layer. These interconnects may be surrounded by the protective layer.

As shown in FIG. 2(*l*), subsequent to the formation of the rewiring structure, an antioxidation layer 209 is formed on the rewiring structure. As noted above, the rewiring structure includes the electrically conductive component and a dielectric layer covering a part of the electrically conductive component. The antioxidation layer covers the remaining part of the electrically conductive component that is not covered by the dielectric layer. The antioxidation layer 209 may be a tin layer, or a bottom-up stack of a nickel layer and a gold layer, or a bottom-up stack of a nickel layer, a palladium layer and a gold layer. By configuring the antioxidation layer 209, it enables to prevent oxidation of the part of the electrically conductive component that is not covered by the dielectric layer, which in turn avoids the degraded electrical conduction properties caused by the oxidation of the electrically conductive component.

In step 107, as shown in FIG. 2(*m*), the carrier substrate 200 is removed to expose the back side of the chip 201 to be packaged. The removal of the carrier substrate 200 may be accomplished by directly mechanical stripping, or otherwise, which is not limited in present disclosure and may be configured depending on the specific application circumstances.

In an embodiment of present disclosure, adhesive layers may be arranged between the carrier substrate 200 and the chip 201 to be packaged, and between the carrier substrate 200 and the plastic encapsulation layer 204. In this case, the carrier substrate 200 may be stripped away by heating the adhesive layers to reduce its adhesiveness. By heating the adhesive layer to strip away the carrier substrate 200, it allows to minimize damages to the chip 201 to be packaged during the removal of the carrier substrate 200.

After the carrier substrate 200 is removed, a flat plate structure including the chip 201 to be packaged, the protective layer 202 covering the front side of the chip 201 to be packaged and the plastic encapsulation layer 204 encapsulating the chip 201 to be packaged.

In one embodiment, in the case that a plurality of chips 201 are packaged at one time, after the packaging of the rewiring structures, the resulting structure may be diced into a plurality of packages using laser or mechanical cutting, as shown in FIG. 2(*m*), so as to form the structure of a package shown in FIG. 4.

FIG. 4 is a structural schematic of a chip packaging structure produced by the above semiconductor packaging method according to an exemplary embodiment of present disclosure. As shown in FIG. 4, the semiconductor packaging structure includes:

a plastic encapsulation layer 204, provided with a concave cavity;

a chip 201 disposed in the cavity with a back side of the chip 201 exposed from a surface of the plastic encapsulation layer 204;

a protective layer 202 formed on a front side of the chip 201, protective layer openings 2021 being formed in the protective layer 202 and lying in locations corresponding to solder pads 2012 on the front side of the chip 201; and a rewiring structure formed on the front side of the chip 201 and configured to lead out the solder pads 2012 on the front side of the chip 201.

In this way, by configuring the back side of the chip exposed from the surface of the plastic encapsulation layer, it helps improve the chip's heat dissipation performance, and enables to assure the continuous efficient operation of chips and to solve the problem of a shortened life of chips due to the overheat.

In an embodiment of present disclosure, by configuring the protective layer made of an organic-inorganic composite material, it enables to effectively mitigate discrepancies between the chip to be packaged and the protective layer in terms of material properties as the organic-inorganic composite material combines characteristics of both organic and inorganic material, thereby enabling to lower the difficulty of the packaging process, enhance packaging quality and ensure packaging success and satisfactory yield.

In some embodiments, the rewiring structure includes: a first rewiring layer 206, which is formed on both the protective layer 202 and the plastic encapsulation layer 204 and electrically connect the solder pads 2012 on the chip 201 via the protective layer openings 2021; and a first dielectric layer 207 formed on the first rewiring layer 206, the exposed part of the protective layer 202 and the plastic encapsulation layer 204. The first dielectric layer 207 has first openings 2071. The first openings 2071 in the first dielectric layer 207 is provided therein with first electrically conductive mesas 208 that electrically connect the first rewiring layer 206.

In this embodiment, the protective layer 202 is made of an organic-inorganic composite material. Since the chip to be packaged is generally made of an inorganic material such as silicon, the organic-inorganic composite material combining the properties of both organic and inorganic materials is able to effectively mitigate discrepancies between the chip to be packaged and the protective layer in terms of material properties, thereby enabling to lower the difficulty of the packaging process, enhance packaging quality and ensure packaging success and satisfactory yield.

For example, the organic-inorganic composite material includes an organic material and filler particles dispersed in the organic material. The filler particles are made of an inorganic material.

For example, the organic material may be made of the material selected from the group consisting of, for example, benzocyclobutene (BCB), polyimide (PI), polybenzoxazole (PBO), organic polymers, organic resins and other materials having similar insulation properties and structural properties. Optionally, the organic material layer in the protective layer may be made of the insulating material that is tolerable to chemical cleaning, polishing, etc.

In an embodiment of present disclosure, the filler particles in the protective layer 202 are inorganic oxide particles. For example, the filler particles include at least one of $SiO_2$ particles and $TiO_2$ particles. In an embodiment of present disclosure, the filler particles in the protective layer 202 are all $SiO_2$ particles, which allow a better packaging performance.

In an embodiment of present disclosure, the filler particles in the protective layer 202 may be present at an amount ranging from 50 w.t. % to 95 w.t. %. When the filler particles are spherical and present at an amount of 50 w.t. % to 95 w.t. %, the filler particles enable the protective layer to be comparable to silicon in terms of material properties, which is favorable to the packaging process.

Further, the filler particles in the protective layer 202 may be present at an amount ranging from 80 w.t. % to 90 w.t. %, which enables the protective layer to be closer to silicon in terms of material properties, which is favorable to the packaging process. In an embodiment of present disclosure, the filler particles in the protective layer 202 are spherical. Such spherical filler particles in the protective layer 202 are conductive to formation of openings with smooth side walls in the subsequent step of forming protective layer openings.

In an embodiment of present disclosure, the filler particles in the protective layer 202 may have a particle size of 0.8 μm to 1.2 μm. This is because a small size of the filler particles facilitates the formation of protective layer openings with smooth side walls in the protective layer and thus enables the sufficient filling of an electrically conductive material during the filling step. On the contrary, the large filler particles tend to form protective layer openings having large bumps and dips on their side walls in the protective layer. The bumps will impede the filling of an electrically conductive material at the back side of the bumps, and thus lead to insufficient electrical conduction of the filled electrically conductive through hole. In addition, the use of the 0.8 μm to 1.2 μm sized filler particles enables to expose the small sized filler particles during the formation of protective layer openings, which offers the side wall a certain degree of roughness. The side wall with a certain degree of roughness results in an expanded contact area and a closer contact with the electrically conductive material, thereby enabling to form electrically conductive through holes with good electrical conduction properties. On the other hand, since the fabrication cost raises with the reduction of particle size, the filler particles is preferred to have an average particle size of 1 μm.

In another embodiment, like the protective layer 202, the plastic encapsulation layer 204 may also be formed of an organic-inorganic composite material. The organic-inorganic composite material includes an organic material and filler particles dispersed in the organic material. The filler particles are formed of an inorganic material.

Specifically, as described above, the organic-inorganic composite material includes an organic material and filler particles dispersed in the organic material. The filler particles are formed of an inorganic material. Since the chip to be packaged is generally made of an inorganic material such as silicon, the organic-inorganic composite material combining the properties of both organic and inorganic materials is able to effectively mitigate discrepancies between the chip to be packaged and the protective layer in terms of material properties, thereby enabling to lower the difficulty of the packaging process, enhance packaging quality and ensure packaging success and satisfactory yield.

As described above, the organic material in the plastic encapsulation layer 204 may be selected from a group consisting of various resin materials, macromolecular materials, polymeric material (e.g., epoxy resins, melamine resins and other polymers). The organic material may be one organic material or a combination of different materials. The organic material may be selected as required by the packaging process, without limitation.

The filler particles in the plastic encapsulation layer 204 are inorganic oxide particles. For example, the filler particles in the plastic encapsulation layer 204 includes at least one of $SiO_2$ particles and $TiO_2$ particles. In an embodiment of present disclosure, the filler particles in the protective layer 202 may be are all $SiO_2$ particles, which provides a better packaging performance.

In an embodiment of present disclosure, the filler particles in the plastic encapsulation layer 204 are present at an amount ranging from 50 w.t. % to 95 w.t. %. When the filler particles are spherical and present at an amount of 50 w.t. % to 95 w.t. %, the filler particles enable the plastic encapsulation layer to be comparable to silicon in terms of material properties, which is favorable to the packaging process.

In an embodiment of present disclosure, the filler particles in the plastic encapsulation layer 204 are present at an amount ranging from 80 w.t. % to 90 w.t. %, which enables the plastic encapsulation layer to be closer to silicon in terms of material properties, and thus is favorable to the packaging process.

In an embodiment of present disclosure, the filler particles in the plastic encapsulation layer 204 are spherical.

For example, the particle size of the filler particles in the protective layer 202 is smaller than that of the filler particles in the plastic encapsulation layer 204. That is, the particle size of the filler particles in the plastic encapsulation layer 204 is greater than that of the filler particles in the protective layer 202. For example, the particle size of the filler particles in the plastic encapsulation layer 204 ranges from 4 μm to 6 μm. Since it is not necessary to form any opening in the plastic encapsulation layer 204, filler particles with large particle size may be used to reduce the fabrication cost. In an embodiment of present disclosure, the filler particles in the plastic encapsulation layer 204 may have an average particle size of 5 μm.

In an alternative embodiment, the rewiring structure includes more than one rewiring layer to achieve the multilayer rewiring of the product.

The device embodiments and the method embodiments of present disclosure may supplement each other if there is no conflict therebetween.

The description presented above is merely that of a few preferred embodiments of the present disclosure and is not intended to limit the scope thereof in any sense. Any and all changes, equivalent substitutions and modifications made without departing from the spirit and concept of present disclosure are intended to fall within the scope thereof.

What is claimed is:

1. A semiconductor packaging method, comprising:
forming a protective layer on a front side of a chip to be packaged, wherein the protective layer is made of an organic-inorganic composite material;
attaching the chip to be packaged, with the protective layer formed on the front side thereof, to a carrier substrate in such a manner that the front side of the chip to be packaged faces upward and a back side of the chip to be packaged faces the carrier substrate; and forming a plastic encapsulation layer to entirely encapsulate the chip to be packaged and the protective layer on the carrier substrate,
wherein the plastic encapsulation layer is made of an organic-inorganic composite material, the organic-inorganic composite material of the protective layer and the organic-inorganic composite material of the plastic encapsulation layer each comprising an organic material and filler particles dispersed in the organic material, the organic-inorganic composite material of the protective layer is able to effectively mitigate discrepancies between the chip to be packaged and the protective layer in terms of material properties,
wherein the filler particles in the protective layer and the filler particles in the plastic encapsulation layer are each made of an inorganic material and are spherical, a particle size of the filler particles in the protective layer is smaller than a particle size of the filler particles in the plastic encapsulation layer,
wherein the filler particles in the protective layer are present at an amount ranging from 50 w.t. % to 95 w.t. %, which enables the protective layer to be closer to silicon in terms of the material properties.

2. The semiconductor packaging method according to claim 1, wherein the filler particles comprise at least one of $SiO_2$ particles and $TiO_2$ particles.

3. The semiconductor packaging method according to claim 1, further comprising, prior to attaching the chip to be packaged with the protective layer formed on the front side thereof to the carrier substrate:
grinding the back side of the chip to be packaged.

4. The semiconductor packaging method according to claim 1, further comprising, subsequent to forming the plastic encapsulation layer:
thinning the plastic encapsulation layer to expose the protective layer on the front side of the chip to be packaged,
forming protective layer openings to expose solder pads on the front side of the chip to be packaged, and
forming, on the front side of the chip to be packaged, a rewiring structure that is configured to lead out the solder pads on the front side of the chip to be packaged.

5. The semiconductor packaging method according to claim 4, further comprising, subsequent to forming the rewiring structure on the front side of the chip to be packaged:
forming an antioxidation layer on the rewiring structure, wherein the rewiring structure comprises an electrically conductive component and a dielectric layer covering a part of the electrically conductive component, and wherein the antioxidation layer covers a remaining part of the electrically conductive component that is not covered by the dielectric layer.

6. The semiconductor packaging method according to claim 5, wherein the antioxidation layer comprises any one of a tin layer, a bottom-up stack of a nickel layer and a gold layer, and a bottom-up stack of a nickel layer, a palladium layer and a gold layer.

7. The semiconductor packaging method according to claim 4, further comprising, subsequent to forming the rewiring structure on the front side of the chip to be packaged:
removing the carrier substrate to expose the back side of the chip to be packaged.

8. The semiconductor packaging method according to claim 7, further comprising an antioxidation layer, wherein the rewiring structure comprises an electrically conductive component and a dielectric layer covering a part of the electrically conductive component, and wherein the antioxidation layer covers a remaining part of the electrically conductive component that is not covered by the dielectric layer.

9. The semiconductor packaging method according to claim 1, wherein the particle size of the filler particles in the protective layer ranges from 0.8 µm to 1.2 µm.

10. The semiconductor packaging method according to claim 1, wherein the particle size of the filler particles in the plastic encapsulation layer ranges from 4 µm to 6 µm.

11. The semiconductor packaging method according to claim 1, wherein the filler particles in the protective layer are present at an amount ranging from 80 w.t. % to 90 w.t. %, which enables the protective layer to be closer to silicon in terms of the material properties.

\* \* \* \* \*